(12) United States Patent
Jayabharathi et al.

(10) Patent No.: US 7,526,691 B1
(45) Date of Patent: Apr. 28, 2009

(54) SYSTEM AND METHOD FOR USING TAP CONTROLLERS

(75) Inventors: Dinesh Jayabharathi, Orange, CA (US); William W. Dennin, Mission Viejo, CA (US)

(73) Assignee: Marvell International Ltd., Hamilton (BM)

( * ) Notice: Subject to any disclaimer, the term of this patent is extended or adjusted under 35 U.S.C. 154(b) by 900 days.

(21) Appl. No.: 10/686,151

(22) Filed: Oct. 15, 2003

(51) Int. Cl.
*G01R 31/317* (2006.01)
*G01R 31/40* (2006.01)

(52) U.S. Cl. .................... 714/724; 714/726
(58) Field of Classification Search ............... 714/724, 714/726, 732, 733, 735; 326/16; 711/100
See application file for complete search history.

(56) References Cited

U.S. PATENT DOCUMENTS

| | | |
|---|---|---|
| 3,800,281 A | 3/1974 | Devore et al. |
| 3,988,716 A | 10/1976 | Fletcher et al. |
| 4,001,883 A | 1/1977 | Strout et al. |
| 4,016,368 A | 4/1977 | Apple, Jr. |
| 4,050,097 A | 9/1977 | Miu et al. |
| 4,080,649 A | 3/1978 | Calle et al. |
| 4,156,867 A | 5/1979 | Bench et al. |
| 4,225,960 A | 9/1980 | Masters |
| 4,275,457 A | 6/1981 | Leighou et al. |
| 4,390,969 A | 6/1983 | Hayes |
| 4,451,898 A | 5/1984 | Palermo et al. |
| 4,486,750 A | 12/1984 | Aoki |
| 4,500,926 A | 2/1985 | Yoshimaru et al. |
| 4,587,609 A | 5/1986 | Boudreau et al. |
| 4,603,382 A | 7/1986 | Cole |
| 4,625,321 A | 11/1986 | Pechar et al. |
| 4,667,286 A | 5/1987 | Young et al. |
| 4,777,635 A | 10/1988 | Glover |
| 4,805,046 A | 2/1989 | Kuroki et al. |
| 4,807,116 A | 2/1989 | Katzman et al. |
| 4,807,253 A | 2/1989 | Hagenauer et al. |
| 4,809,091 A | 2/1989 | Miyazawa et al. |
| 4,811,282 A | 3/1989 | Masina |
| 4,812,769 A | 3/1989 | Agoston |

(Continued)

FOREIGN PATENT DOCUMENTS

EP    0528273    2/1993

(Continued)

OTHER PUBLICATIONS

PCT International Search Report, Doc. No. PCT/US00/15084, Dated Nov. 15, 2000, 2 Pages.

(Continued)

*Primary Examiner*—Cynthia Britt
*Assistant Examiner*—Dipakkumar Gandhi

(57) ABSTRACT

A system and method for dynamically writing to and reading from an internal register space of a chip using a TAP controller without interfering with the normal operation of the chip is provided. Data that is to be written is loaded into a data register in the TAP controller before being written in the internal register space and the write instructions are loaded into an instruction register of the TAP controller. The address of the internal register space from where data is to be read is also loaded to the data register. Data is read and/or written from the internal register space after the TAP controller gets access to the internal register space via arbitration.

22 Claims, 5 Drawing Sheets

U.S. PATENT DOCUMENTS

| | | |
|---|---|---|
| 4,860,333 A | 8/1989 | Bitzinger et al. |
| 4,866,606 A | 9/1989 | Kopetz |
| 4,881,232 A | 11/1989 | Sako et al. |
| 4,920,535 A | 4/1990 | Watanabe et al. |
| 4,949,342 A | 8/1990 | Shimbo et al. |
| 4,970,418 A | 11/1990 | Masterson |
| 4,972,417 A | 11/1990 | Sako et al. |
| 4,975,915 A | 12/1990 | Sako et al. |
| 4,989,190 A | 1/1991 | Kuroe et al. |
| 5,014,186 A | 5/1991 | Chisholm |
| 5,023,612 A | 6/1991 | Liu |
| 5,027,357 A | 6/1991 | Yu et al. |
| 5,050,013 A | 9/1991 | Holsinger |
| 5,051,998 A | 9/1991 | Murai et al. |
| 5,068,755 A | 11/1991 | Hamilton et al. |
| 5,068,857 A | 11/1991 | Yoshida |
| 5,072,420 A | 12/1991 | Conley et al. |
| 5,088,093 A | 2/1992 | Storch et al. |
| 5,109,500 A | 4/1992 | Iseki et al. |
| 5,117,442 A | 5/1992 | Hall |
| 5,127,098 A | 6/1992 | Rosenthal et al. |
| 5,133,062 A | 7/1992 | Joshi et al. |
| 5,136,592 A | 8/1992 | Weng |
| 5,146,585 A | 9/1992 | Smith, III |
| 5,157,669 A | 10/1992 | Yu et al. |
| 5,162,954 A | 11/1992 | Miller et al. |
| 5,193,197 A | 3/1993 | Thacker |
| 5,204,859 A | 4/1993 | Paesler et al. |
| 5,218,564 A | 6/1993 | Haines et al. |
| 5,220,569 A | 6/1993 | Hartness |
| 5,237,593 A | 8/1993 | Fisher et al. |
| 5,243,471 A | 9/1993 | Shinn |
| 5,249,271 A | 9/1993 | Hopkinson |
| 5,257,143 A | 10/1993 | Zangenehpour |
| 5,261,081 A | 11/1993 | White et al. |
| 5,271,018 A | 12/1993 | Chan |
| 5,274,509 A | 12/1993 | Buch |
| 5,276,564 A | 1/1994 | Hessing et al. |
| 5,276,662 A | 1/1994 | Shaver, Jr. et al. |
| 5,276,807 A | 1/1994 | Kodama et al. |
| 5,280,488 A | 1/1994 | Glover et al. |
| 5,285,327 A | 2/1994 | Hetzler |
| 5,285,451 A | 2/1994 | Henson et al. |
| 5,301,333 A | 4/1994 | Lee |
| 5,307,216 A | 4/1994 | Cook et al. |
| 5,315,708 A | 5/1994 | Eidler et al. |
| 5,339,443 A | 8/1994 | Lockwood |
| 5,361,266 A | 11/1994 | Kodama et al. |
| 5,361,267 A | 11/1994 | Godiwala et al. |
| 5,408,644 A | 4/1995 | Schneider et al. |
| 5,420,984 A | 5/1995 | Good et al. |
| 5,428,627 A | 6/1995 | Gupta |
| 5,440,751 A | 8/1995 | Santeler et al. |
| 5,465,343 A | 11/1995 | Henson et al. |
| 5,487,170 A | 1/1996 | Bass et al. |
| 5,488,688 A | 1/1996 | Gonzales et al. |
| 5,491,701 A | 2/1996 | Zook |
| 5,500,848 A | 3/1996 | Best et al. |
| 5,506,989 A | 4/1996 | Boldt et al. |
| 5,507,005 A | 4/1996 | Kojima et al. |
| 5,519,837 A | 5/1996 | Tran |
| 5,523,903 A | 6/1996 | Hetzler et al. |
| 5,544,180 A | 8/1996 | Gupta |
| 5,544,346 A | 8/1996 | Amini |
| 5,546,545 A | 8/1996 | Rich |
| 5,546,548 A | 8/1996 | Chen et al. |
| 5,563,896 A | 10/1996 | Nakaguchi |
| 5,572,148 A | 11/1996 | Lytle et al. |
| 5,574,867 A | 11/1996 | Khaira |
| 5,581,715 A | 12/1996 | Verinsky et al. |
| 5,583,999 A | 12/1996 | Sato et al. |
| 5,592,404 A | 1/1997 | Zook |
| 5,600,662 A | 2/1997 | Zook et al. |
| 5,602,857 A | 2/1997 | Zook et al. |
| 5,615,190 A | 3/1997 | Best et al. |
| 5,623,672 A | 4/1997 | Popat |
| 5,627,695 A | 5/1997 | Prins et al. |
| 5,629,949 A | 5/1997 | Zook |
| 5,640,602 A | 6/1997 | Takase |
| 5,649,230 A | 7/1997 | Lentz |
| 5,664,121 A | 9/1997 | Cerauskis |
| 5,689,656 A | 11/1997 | Baden et al. |
| 5,691,994 A | 11/1997 | Acosta et al. |
| 5,692,135 A | 11/1997 | Alvarez, II et al. |
| 5,692,165 A | 11/1997 | Jeddeloh et al. |
| 5,719,516 A | 2/1998 | Sharpe-Geisler |
| 5,729,718 A | 3/1998 | Au |
| 5,740,466 A | 4/1998 | Geldman |
| 5,745,793 A | 4/1998 | Atsatt et al. |
| 5,754,759 A | 5/1998 | Clarke et al. |
| 5,758,188 A | 5/1998 | Applebaum et al. |
| 5,784,569 A | 7/1998 | Miller et al. |
| 5,794,073 A | 8/1998 | Ramakrishnan et al. |
| 5,801,998 A | 9/1998 | Choi |
| 5,818,886 A | 10/1998 | Castle |
| 5,822,142 A | 10/1998 | Hicken |
| 5,831,922 A | 11/1998 | Choi |
| 5,835,930 A | 11/1998 | Dobbek |
| 5,841,722 A | 11/1998 | Willenz |
| 5,844,844 A | 12/1998 | Bauer et al. |
| 5,850,422 A | 12/1998 | Chen |
| 5,854,918 A | 12/1998 | Baxter |
| 5,890,207 A | 3/1999 | Sne et al. |
| 5,890,210 A | 3/1999 | Ishii et al. |
| 5,907,717 A | 5/1999 | Ellis |
| 5,912,906 A | 6/1999 | Wu et al. |
| 5,925,135 A | 7/1999 | Trieu et al. |
| 5,937,435 A | 8/1999 | Dobbek et al. |
| 5,950,223 A | 9/1999 | Chiang et al. |
| 5,968,180 A | 10/1999 | Baco |
| 5,983,293 A | 11/1999 | Murakami |
| 5,991,911 A | 11/1999 | Zook |
| 6,029,226 A | 2/2000 | Ellis et al. |
| 6,029,250 A | 2/2000 | Keeth |
| 6,041,417 A | 3/2000 | Hammond et al. |
| 6,065,053 A | 5/2000 | Nouri et al. |
| 6,067,206 A | 5/2000 | Hull et al. |
| 6,070,200 A | 5/2000 | Gates et al. |
| 6,078,447 A | 6/2000 | Sim |
| 6,081,849 A | 6/2000 | Born et al. |
| 6,085,275 A * | 7/2000 | Gallup et al. ............... 710/316 |
| 6,092,231 A | 7/2000 | Sze |
| 6,094,320 A | 7/2000 | Ahn |
| 6,124,994 A | 9/2000 | Malone, Sr. |
| 6,134,063 A | 10/2000 | Weston-Lewis et al. |
| 6,145,100 A * | 11/2000 | Madduri ..................... 714/45 |
| 6,157,984 A | 12/2000 | Fisher |
| 6,178,486 B1 | 1/2001 | Gill et al. |
| 6,192,499 B1 | 2/2001 | Yang |
| 6,201,655 B1 | 3/2001 | Watanabe et al. |
| 6,223,303 B1 | 4/2001 | Billings et al. |
| 6,279,089 B1 | 8/2001 | Schibilla et al. |
| 6,297,926 B1 | 10/2001 | Ahn |
| 6,330,626 B1 | 12/2001 | Dennin et al. |
| 6,381,659 B2 | 4/2002 | Proch et al. |
| 6,401,149 B1 | 6/2002 | Dennin et al. |
| 6,415,393 B2 * | 7/2002 | Satoh ......................... 714/30 |
| 6,470,461 B1 | 10/2002 | Pinvidic et al. |
| 6,487,631 B2 | 11/2002 | Dickinson et al. |
| 6,490,635 B1 | 12/2002 | Holmes |
| 6,530,000 B1 | 3/2003 | Krantz et al. |
| 6,574,676 B1 | 6/2003 | Megiddo |
| 6,662,334 B1 | 12/2003 | Stenfort |
| 6,826,650 B1 | 11/2004 | Krantz et al. |

| | | | |
|---|---|---|---|
| 2001/0044873 | A1 | 11/2001 | Wilson et al. |
| 2002/0062466 | A1* | 5/2002 | Noguchi .................... 714/738 |
| 2003/0037225 | A1 | 2/2003 | Deng et al. |
| 2003/0110344 | A1* | 6/2003 | Szczepanek et al. ........ 711/100 |

FOREIGN PATENT DOCUMENTS

| | | |
|---|---|---|
| EP | 0622726 | 11/1994 |
| EP | 0718827 | 6/1996 |
| GB | 2285166 | 6/1995 |
| JP | 63-292462 | 11/1988 |
| JP | 01-315071 | 12/1989 |
| JP | 03183067 | 8/1991 |
| WO | 98/14861 | 4/1998 |

OTHER PUBLICATIONS

Blathut R. Digital Transmission of Information (Dec. 4, 1990), pp. 429-430.

Hwang, Kai and Briggs, Faye A., "Computer Architecture and Parallel Processing" pp. 156-164.

Zeidman, Bob, "Interleaving DRAMS for faster access", System Design ASIC & EDA, pp. 24-34 (Nov. 1993).

P.M. Bland et. al. Shared Storage Bus Circuitry, IBM Technical Disclosure Bulletin, vol. 25, No. 4, Sep. 1982, pp. 2223-2224.

PCT search report for PCT/US00/07780 mailed Aug. 2, 2000, 4 Pages.

PCT Search Report for PCT/US01/22404, mailed Jan. 29, 2003, 4 Pages.

* cited by examiner

SYSTEM AND METHOD FOR USING TAP CONTROLLERS

BACKGROUND OF THE INVENTION

1. Field of the Invention

The present invention relates to integrated circuits, and more particularly, to using TAP controllers.

2. Background

Conventional computer systems typically include several functional components. These components may include a central processing unit (CPU), main memory, input/output ("I/O") devices, and storage devices (for example, tape drives, disk drives etc.) (referred to herein as "storage device")

In conventional systems, the main memory is coupled to the CPU via a system bus or a local memory bus. The main memory is used to provide the CPU access to data and/or program information that is stored in main memory at execution time. Typically, the main memory is composed of random access memory (RAM) circuits. A computer system with the CPU and main memory is often referred to as a host system.

The storage device is coupled to the host system via a storage device controller that handles complex details of interfacing the storage device(s) to the host system. Communications between the host system and the controller is usually provided using one of a variety of standard input/output ("I/O") bus interfaces.

Storage controllers are coupled using various standards, for example, the fibre channel standard incorporated herein by reference in its entirety.

As bandwidth increases, host systems and storage devices must transfer data efficiently. Because of high demand, it is desirable that the internal register files of integrated circuits (also referred to as "chips") used in (or as) storage controllers be accessed real-time without disrupting normal chip operation for de-bugging or any other purpose.

A standard, IEEE 11491.1 and 11491A was developed (referred to as the JTAG standard) for testing of integrated circuits after assembly onto a printed circuit board, incorporated herein by reference in its entirety. The JTAG standard provides for testing numerous integrated circuits on a board as well as the interconnection of those circuits to the printed conductors of the board. Testing is performed using pins associated with a test access port ("TAP").

TAP controllers are used to access chip information at a tap controller clock (tclk). In traditional systems, all chip operations stop when a chip is debugged using the JTAG standard. This is commercially undesirable because engineers may want to access the internal registers of a chip while it is operational.

Therefore, there is a need for a method and system that allows dynamic access to a chip via a TAP port during normal chip operation.

SUMMARY OF THE INVENTION

In one aspect of the present invention, a method for dynamically writing to an internal register space of a chip using a test access port ("TAP") controller without interfering with the normal operation of the chip is provided. The method includes, loading write instructions and address of the internal register where data is to be written; and gaining access through arbitration to the internal register space.

Data that is to be written is loaded into a data register in the TAP controller before being written in the internal register space and the write instructions are loaded into an instruction register of the TAP controller.

In another aspect of the present invention, a method for dynamically reading from an internal register space of a chip without interfering with the normal operation of the chip is provided. The method includes, loading an address of the internal register space from where data is to be read, to the data register; gaining access to the internal register; and transferring information to a register in the TAP controller.

In yet another aspect of the present invention, a system for accessing an internal register space of a chip without interfering with the normal operation of the chip is provided. The system includes, an instruction register in the TAP controller to which read and/or write instructions are written; and an arbitration module that receives an input from the TAP controller when the TAP controller needs to access the internal register space.

In yet another aspect of the present invention, a TAP controller for dynamically accessing an internal register space in a chip without interfering the normal operation of the chip is provided. The TAP controller includes, an instruction register in the TAP controller to which read and/or write instructions are written; and a data register where data is stored after the TAP controller reads it from the internal register space, and/or data that is to be written into the internal register is first written to the data register.

In one aspect of the present invention, debugging can be performed dynamically because the internal registers of a chip can be accessed without interrupting the normal operation of the entire chip. This provides flexibility in debugging chips while using the JTAG standard.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures.

DETAILED DESCRIPTION OF THE PREFERRED EMBODIMENTS

To facilitate an understanding of the preferred embodiment, the general architecture and operation of a controller will initially be described. The specific architecture and operation of the preferred embodiment will then be described with reference to the general architecture.

Figure 1A:
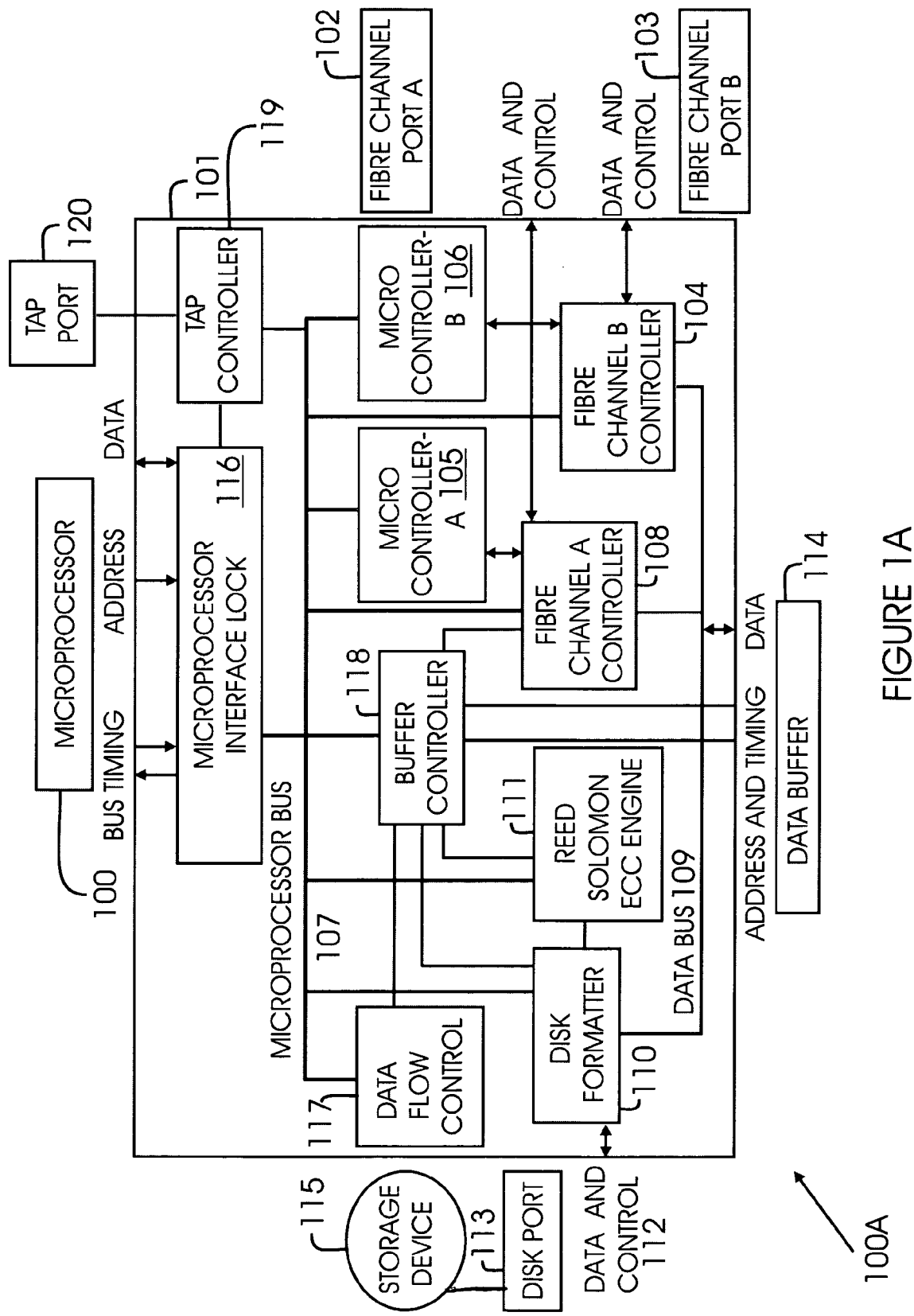
FIGS. 1A and 1B are block diagrams of a controller, used according to one aspect of the present invention.

System 100A of FIG. 1A is an example of a storage system controller, included (or coupled to) in a computer system. The host computer (not shown) and a storage device 115 communicate via port 113. In an alternate embodiment (not shown), the storage device 115 is an external storage device, which is connected to the host computer via a data bus. Those skilled in the art will appreciate that various communication buses known in the art can be used to transfer data between the drive and the host system.

As shown in FIG. 1A, the system includes controller 101, which is coupled to fibre channel ports 102 and 103, buffer memory 114 and microprocessor 100. Interface 116 serves to couple microprocessor bus 107 to microprocessor 100. A read only memory ("ROM") omitted from the drawing is used to store firmware code executed by microprocessor 100.

Controller 101 can be an integrated circuit (IC) that comprises of various functional modules, which provide for the writing and reading of data stored on storage device 115 or to other devices through fibre channel ports 102 and 103.

Microprocessor 100 is coupled to controller 101 via interface 116 to facilitate transfer of data, address, timing and control information. Buffer memory 114 is coupled to controller 101 via ports to facilitate transfer of data, timing and address information.

Data flow controller 117 is connected to microprocessor bus 107 and to buffer controller 118.

Disk formatter 110 formats data that is flowing through system 100A, either from storage device 115 or from fibre channel ports 102/103.

Fibre channel controllers 104 and 108 include programmable registers and state machine sequencers that interface with ports 102 and 103. The fibre channel controllers 104 and 108 provide fibre channel control for ports 102 and 103.

Figure 1B:
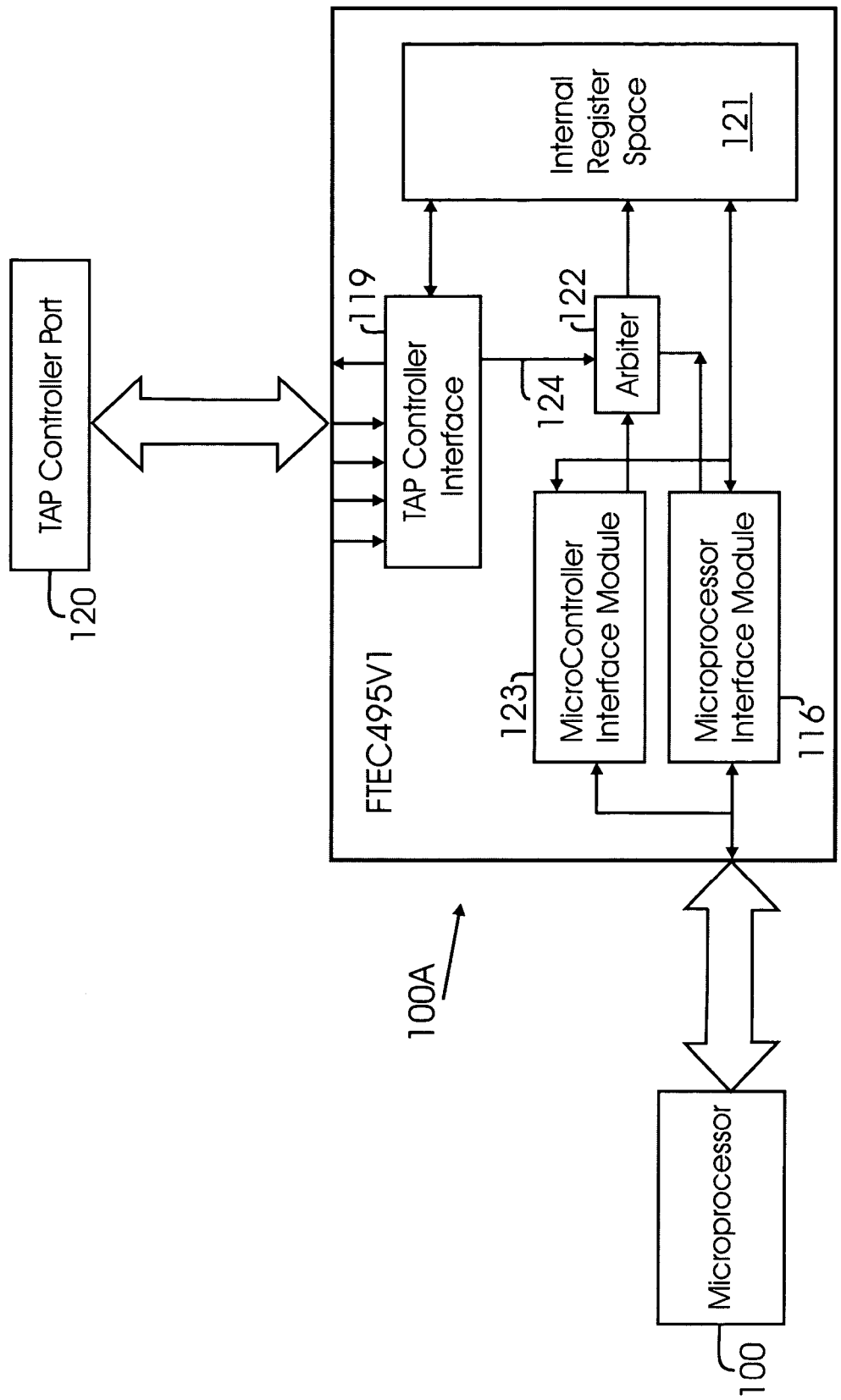

Microcontrollers 105 and 106 allow customization of fibre channel sequences and control Fibre channel controllers 104 and 108 through a microcontroller interface module 123 (FIG. 1B).

ECC engine 111 provides error correction for system 100A.

TAP controller 119, described in more detail below, is used to dynamically access the internal registers (for read and/or write) of system 100A, without interfering with the normal operation of system 100A. This enhances the overall debugging capabilities of system 100A. Information from TAP controller 119 is sent to TAP controller port 120 and can be accessed outside system 100A.

FIG. 1B shows a simplified block diagram of system 100A. System 100A includes internal register space 121 that can accessed by various components, including TAP controller 119 (may also be referred to as TAP controller interface 119).

An arbitration module ("arbiter") 122 receives requests from various modules including microprocessor interface 116 and microcontroller interface 123 to access internal registers 121. Other components, for example, buffer controller 118 may also access the register space via arbiter 122.

Figure 2:
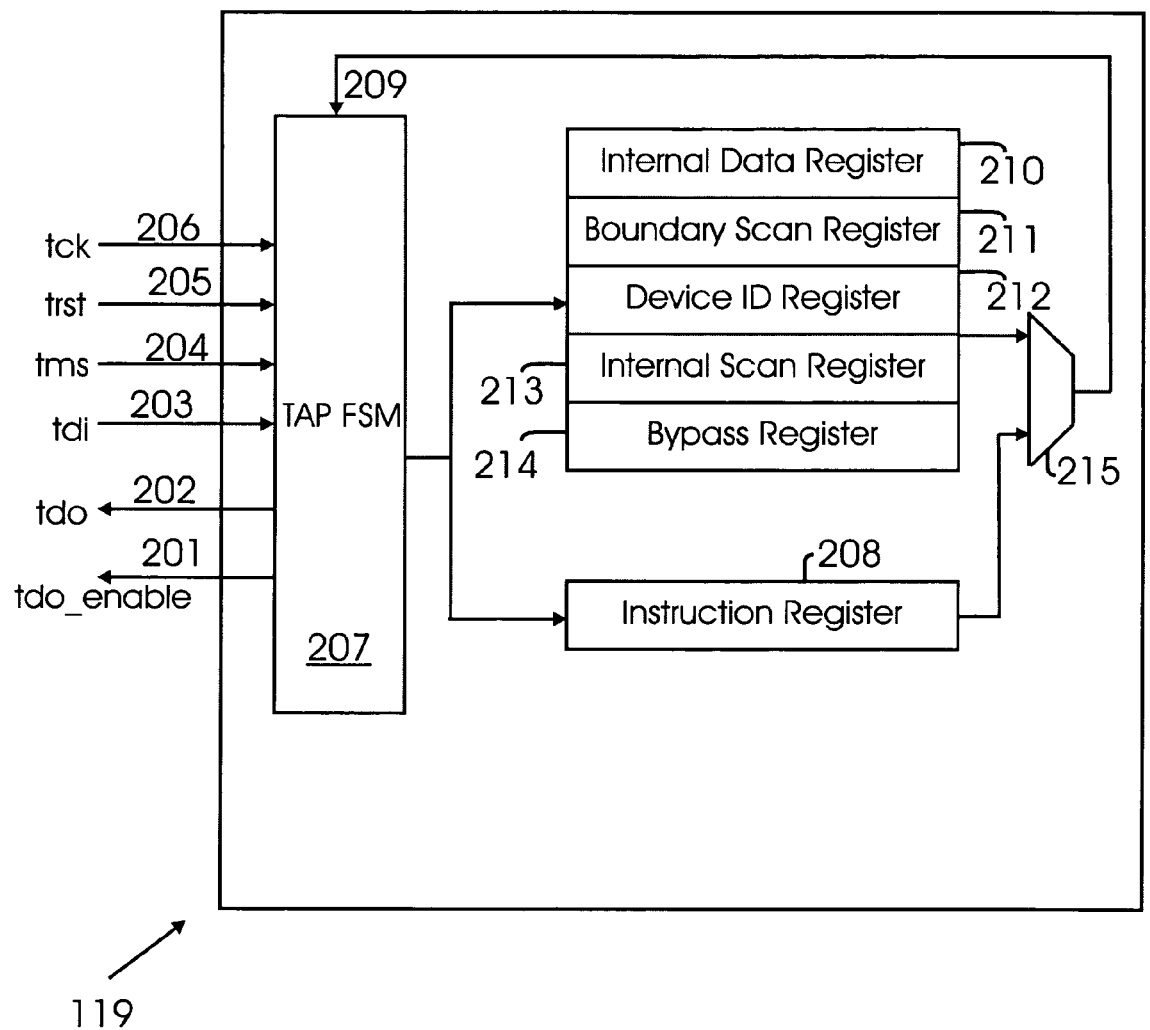
FIG. 2 is a block diagram of a TAP controller, according to one aspect of the present invention.

FIG. 2 shows a detailed diagram of TAP controller 119, according to one aspect of the present invention. TAP controller 119 includes a TAP controller state machine ("TAP FSM) 207 that receives plural inputs, including a clock input (tck) 206; a reset input (trst) 205 that can reset TAP controller 119; and a mode select input (tms) 204; and input tdi 203 that allows loading of TAP controller 119 register bits. TAP controller 119 provides output (tdo) 202 that uses tclk 206 and is enabled using tdo_enable bit 201.

TAP controller 119 also includes a Multiplexer 215 whose output 209 is sent to TAP FSM 207.

In one aspect of the present invention, TAP controller 119 uses plural registers; including an instruction register 208 and data register 210 to dynamically access internal register space 121 while system 100A is functional.

Instruction register 208 and data register 210 are used to access internal register space 121. Internal registers 121 can be accessed from outside system 100A using microprocessor interface 116 or Microcontroller interface 123.

If system 100A is not fully functional or goes to an unknown state, and if it is not able to recover, microprocessor interface 116 or microcontroller interface 123 are not be able to access registers 121. In such a case, TAP controller 119, which runs on tck clock 206 and has its own I/O pins can be used to access internal register space 121. This solution uses very little of the total logic and functions of system 100A.

Instruction from data register 210 can be loaded using TAP controller 119. The other registers of TAP controller 119 can also be loaded this way. The bits in data register 210 are used to define a cycle type (read command). One bit determines if it is a Read (1) or Write (0) cycle, and the other bit determines if it is a Byte (1) access or Word (0) access. The address of the register to be accessed is loaded into data register 210 and the data to be written (during a Write operation) is also stored in data register 210.

For a Read operation the returned data is stored in data register 210, which is then shifted out through tdo output port 202. To ensure the validity of the data, a Data ready signal (which indicates that the read Data is ready), is also stored and shifted out.

Figure 3:
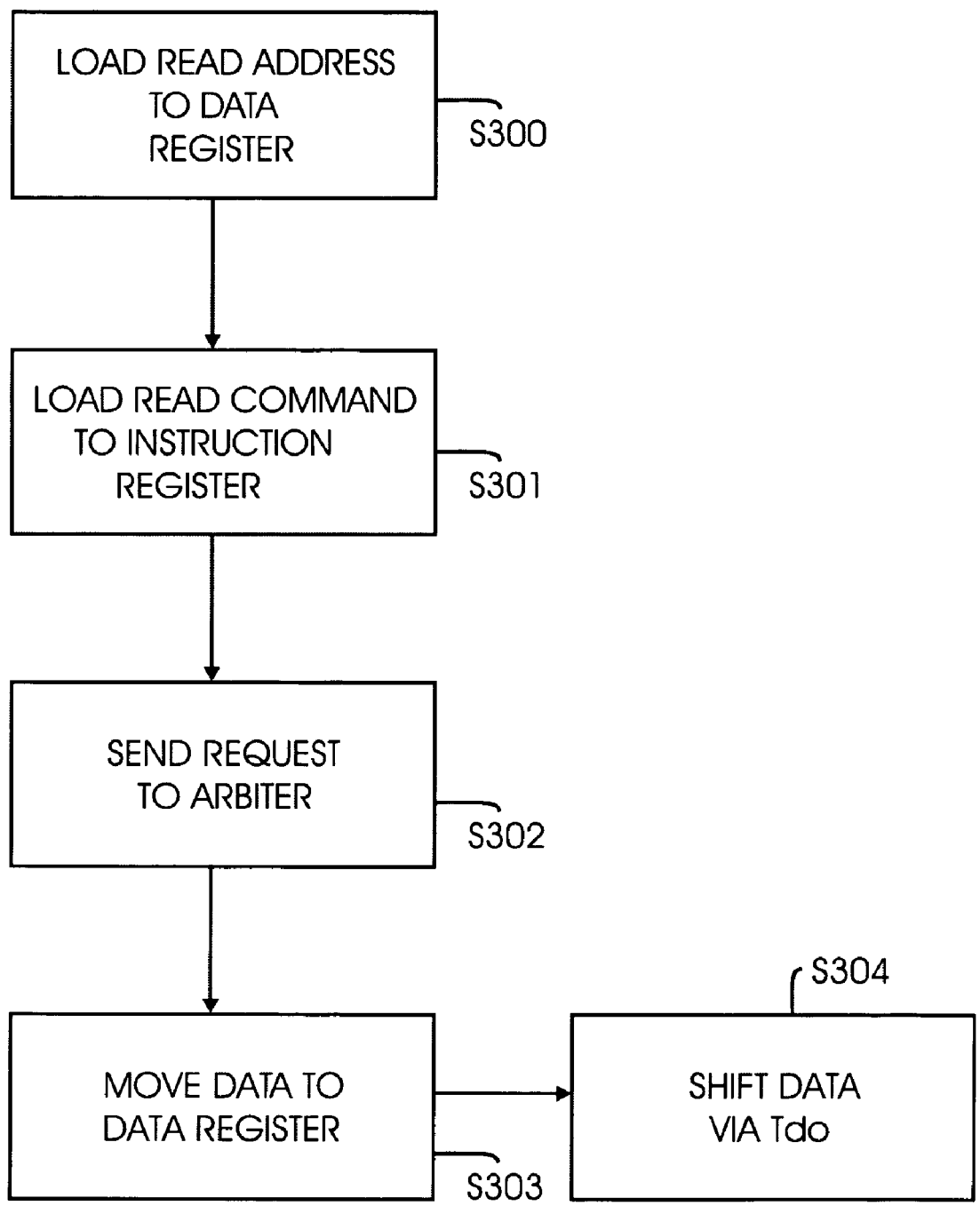
FIG. 3 shows a flow diagram of process steps for reading internal register space of a controller using a TAP controller, according to one aspect of the present invention.

FIG. 3 shows a flow diagram of process steps for reading internal register space 121 using TAP controller 119 while system 100A is operational, according to one aspect of the present invention.

Turning in detail to FIG. 3, in step S300, the address is loaded into data register 210 and the access width (for example, 8 bit or 16 bit) is loaded into instruction register 208.

In step S301, a read command is loaded into instruction register 208.

In step S302, a request is sent to arbiter 122 to gain access to internal register space 121, as specified by the address.

In step S303, after the request is granted, data is moved to data register 210 and then shifted out in step S304, via tdo output 202.

Figure 4:
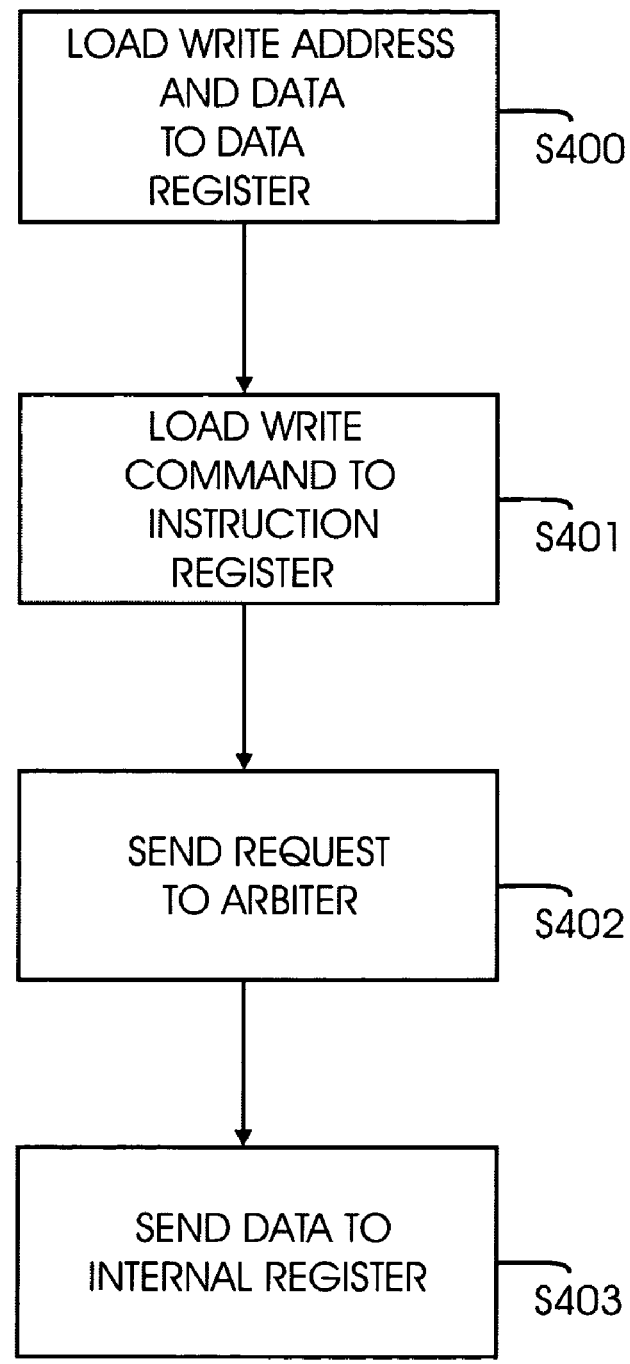
FIG. 4 shows a flow diagram of process steps for writing to internal register space of a controller using a TAP controller, according to one aspect of the present invention.

FIG. 4 shows a flow diagram of process steps for dynamically writing to internal register space 121 using TAP controller 119 while system 100A is operational, according to one aspect of the present invention.

Turning in detail to step S400, the write address and data that needs to be written into internal register space 121 is loaded into data register 210.

In step S401, a write command is loaded into instruction register 208.

In step S402, a request to gain access to internal register space 121 is sent to arbiter 122. Thereafter, in step S403, data is sent to internal register space 121.

In one aspect of the present invention, debugging can be performed dynamically because the internal registers of a chip can be accessed without interrupting the normal operation of the entire chip. This provides flexibility in debugging chips while using the JTAG standard.

It is noteworthy that although the foregoing aspects have been described with respect to the JTAG standard, the adaptive aspects of the present invention are not limited to the JTAG standard. The foregoing process/system may be used to test any chip or integrated circuit, using any other standard.

Although the present invention has been described with reference to specific embodiments, these embodiments are illustrative only and not limiting. Many other applications and embodiments of the present invention will be apparent in light of this disclosure.

What is claimed is:

1. A method for accessing internal memory of a disk controller, comprising:
    storing disk controller control data in a first memory that is located in the disk controller;
    requesting the control data from the first memory; and
    transferring the control data from the first memory to a second memory, wherein the second memory is located on a test access port controller and the test access port controller is located on the disk controller.

2. The method of claim 1 further comprising transferring the control data from the second memory to a device that is external to the disk controller.

3. The method of claim 1 further comprising loading at least one of a write instruction, a read instruction, and a memory address that corresponds to the first memory into the second memory.

4. The method of claim 1 further comprising providing access to the first memory with an arbitration module.

5. The method of claim 1 wherein at least one of the first memory and the second memory is a register.

6. The method of claim 1 further comprising:
    writing data to the first memory; and
    subsequently writing the data to the second memory.

7. The method of claim 1 further comprising:
    loading a read command in the second memory;
    loading an address of the first memory in the second memory;
    transferring the control data from the first memory to the second memory according to the read command and the address.

8. The method of claim 1, further comprising acquiring access to the second memory using an arbitration module.

9. A disk controller comprising:
    a first memory that stores disk controller control data;
    a test access port controller that communicates with the first memory; and
    a second memory that is located in the test access port controller,
    wherein the test access port controller receives a request for the control data from a device that is external to the disk controller and transfers the control data from the first memory to the second memory.

10. The disk controller of claim 9 wherein the test access port controller transfers the control data from the second memory to the device.

11. The disk controller of claim 9 wherein the test access port controller loads at least one of a write instruction, a read instruction, and a memory address that corresponds to the first memory into the second memory.

12. The disk controller of claim 9 further comprising an arbitration module that receives a request from the test access port controller to access the first memory.

13. The disk controller of claim 9 wherein at least one of the first memory and the second memory is a register.

14. The disk controller of claim 9 wherein the test access port controller writes data to the first memory and subsequently writes the data to the second memory.

15. The disk controller of claim 9 wherein the test access port controller loads a read command in the second memory, loads an address of the first memory in the second memory, and transfers the control data from the first memory to the second memory according to the read command and the address.

16. A disk controller comprising:
    first memory means for storing disk controller control data;
    test access port controller means for communicating with the first memory means; and
    second memory means that is located in the test access port controller means,
    wherein the test access port controller means receives a request for the control data from a device that is external to the disk controller and transfers the control data from the first memory means to the second memory means.

17. The disk controller of claim 16 wherein the test access port controller means transfers the control data from the second memory means to the device.

18. The disk controller of claim 16 wherein the test access port controller means loads at least one of a write instruction, a read instruction, and a memory address that corresponds to the first memory means into the second memory means.

19. The disk controller of claim 16 further comprising arbitration means for receiving a request from the test access port controller means to access the first memory means.

20. The disk controller of claim 16 wherein at least one of the first memory means and the second memory means is a register.

21. The disk controller of claim 16 wherein the test access port controller means writes data to the first memory means and subsequently writes the data to the second memory means.

22. The disk controller of claim 16 wherein the test access port controller means loads a read command in the second memory means, loads an address of the first memory means in the second memory means, and transfers the control data from the first memory means to the second memory means according to the read command and the address.

* * * * *